United States Patent [19]

Komoda et al.

[11] Patent Number: 6,000,050
[45] Date of Patent: Dec. 7, 1999

[54] METHOD FOR MINIMIZING GROUND BOUNCE DURING DC PARAMETRIC TESTS USING BOUNDARY SCAN REGISTER

[75] Inventors: Michio Komoda, Hyogo, Japan; Timothy Neal Ayres, Milpitas; Amitava Majumdar, Fremont, both of Calif.

[73] Assignee: Synopsys, Inc., Mountain View, Calif.

[21] Appl. No.: 08/956,872

[22] Filed: Oct. 23, 1997

[51] Int. Cl.$^6$ ................................................. G01R 31/28
[52] U.S. Cl. ........................................ 714/724; 714/726
[58] Field of Search .................................. 714/724, 726, 714/727, 733, 734; 324/158.1, 73.1, 76.11

[56] References Cited

U.S. PATENT DOCUMENTS

| | | | |
|---|---|---|---|
| 4,045,736 | 8/1977 | Carpenter et al. | 324/158.1 |
| 4,504,783 | 3/1985 | Zasio et al. | 324/73 |
| 4,553,049 | 11/1985 | Cha et al. | 307/443 |
| 4,989,209 | 1/1991 | Littlebury et al. | 371/22.1 |
| 5,039,602 | 8/1991 | Merrill et al. | 324/73.1 |
| 5,101,153 | 3/1992 | Morong, III | 324/158.1 |
| 5,115,191 | 5/1992 | Yoshimori | 324/158 |
| 5,283,518 | 2/1994 | King et al. | 324/158.1 |
| 5,394,121 | 2/1995 | Cipolla et al. | 333/124 |
| 5,610,833 | 3/1997 | Chang et al. | 364/491 |

OTHER PUBLICATIONS

"Bounce Case Study", Dec. 1995, Integrated System Design, pp. 19–20, 20–27.
"Performing DC Parametric Tests with Boundary Scan Logic", Oct. 1996, Sunrise Test Systems, Proprietary Information, 2.3 Release Notes, pp. 2–8 to 2–10, 5–12 to 5–14, 8–11 to 8–12.
Senthinathan et al., "Application Specific CMOS Output Driver Circuit Design Techniques to Reduce Simultaneous Switching Noise", Dec. 1993, IEEE, vol. 28, No. 12, pp. 1383–1388.
Zarkesh, et al., "On–Chip Power Evaluation Methods and Issues", Design SuperCon 97, pp. 1–35.

*Primary Examiner*—Hoa T. Nguyen
*Attorney, Agent, or Firm*—DO'Alessandro & Ritchie

[57] ABSTRACT

The method of controlling ground bounce during DC parametric tests disclosed herein is based on the formulation of tests that best achieve two broad goals. The first goal is to reduce the number of I/O pins that are switched simultaneously. In the formulation of the VIL and VIH tests this goal is implemented by preferably only switching one input at a time. The second goal is to simultaneously switch I/O pins that are distant from one another. In the formulation of the VOL and VOH tests this goal is implemented by partitioning the outputs into subsets and selecting preferably one and only one output at a time from each and every subset.

36 Claims, 9 Drawing Sheets

METHOD FOR MINIMIZING GROUND BOUNCE DURING DC PARAMETRIC TESTS USING BOUNDARY SCAN REGISTER

BACKGROUND OF THE INVENTION

1. Field of the Invention

This invention relates generally to the field of methods for DC parametric testing. More specifically, this invention relates to methods for minimizing ground bounce during DC parametric testing using boundary scan registers.

2. The Conventional Art

At least at one point during the manufacture of integrated circuits (ICs) it is desirable to test the integrity and performance of the interface between the IC and the outside world. This interface includes, among others, inputs, outputs, and power pins. Inputs and outputs can come in various types such as unidirectional, bidirectional, and 3-state. Power pins can have various DC voltage values such as ground, positive three, and positive five. The specific choices from among the various types of inputs, outputs, and power pins is dictated by the design of the IC.

One group of tests for integrity and performance of the IC interface are DC parametric tests. DC parametric tests consist of three sets of tests. First, there are the input parametric tests of voltage input low (VIL) and voltage input high (VIH). The purpose of the input parametric tests is to determine the DC characteristics of the IC interface with a logic 0 and a logic 1, respectively, driven at the inputs. Second, there are the output parametric tests of voltage output low (VOL) and voltage output high (VOH). The purpose of the output parametric tests is to determine the DC characteristics of the IC interface with the appropriate input to drive a logic 0 and a logic 1, respectively, at the outputs. Third, there is the leakage test for 3-state output buffers. The purpose of the leakage test is to determine the amount of current sunk or sourced by 3-state output buffers when they are in their high-impedance state.

Those of ordinary skill in the art will realize that a boundary scan register (BSR) is a multi-function register that usually resides between the input/output (I/O) buffers and the core logic of an IC. The BSR includes sets of storage cells, known as boundary scan (BS) cells. These BS cells can function in one of three ways. First, the BS cell can drive the input of an output buffer. Second, the BS cell can be driven by the output of an input buffer. Third, the BS cell can control the enable signal of one or more 3-state output buffer. A shift mode allows external control over the contents of the BS cells in the BSR. The shift mode in conjunction with a parallel drive mode allows control of the outputs independent of the core logic. Similarly, shift mode and parallel load mode provides observability of the inputs. Controlling the BSR is done using external I/O pins usually through a finite state machine.

Turning first to FIG. 1, a block diagram of IC 10 having a BSR is shown. Those of ordinary skill in the art will realize that the BSR shown is only for example purposes. The actual layout, order, function, and number of BS cells will depend on the specific application. Further, IC 10 may well have additional pins, depending on the design, which are not shown in the interest of clarity. In FIG. 1, the BSR starts with the BSR input pin 12. In accordance with the IEEE 1149.1 standard, the BSR input pin 12 is known as the test data in (TDI) pin. Next the BSR includes bidirectional output BS cell 16 (b0) connected between the core logic (not shown) of IC 10 and bidirectional output buffer 18 which is in turn connected to bidirectional pin 24. In this case, pin 24 is bidirectional so that it is also connected to bidirectional input buffer 30 which is in turn connected to bidirectional input BS cell 28 (b1) which is further in turn connected to the core logic. Bidirectional output enable BS cell 22 (e0) controls bidirectional output buffer 18. For reference purposes, also labeled are bidirectional output 20 and bidirectional input 26. Next the BSR includes 3-state output BS cell 34 (t0) which is connected between the core logic and 3-state output buffer 36 which is in turn connected to 3-state output pin 38. In this case, there is a second 3-state output BS cell 60 (t1) which is connected between the core logic and 3-state output buffer 62 which is in turn connected to 3-state output pin 64. 3-state output buffers 36 and 62 are controlled by 3-state output enable BS cell 56 (e1). Next the BSR includes 2-state output BS cell 42 which is connected between the core logic and 2-state output buffer 44 which is in turn connected to 2-state output pin 46. Next the BSR includes input BS cell 50 which is connected between the core logic and input buffer 52 which is in turn connected to input pin 54. Finally, the BSR ends with BSR output pin 68. In accordance with the IEEE 1149.1 standard, the BSR output pin 68 is known as the test data out (TDO) pin.

The remaining pins 14, 32, 40, 48, 58, and 66 are power pins which are connected to the power rails (not shown) of IC 10. During the discussion and examples that follow, whether a particular power pin (14, 32, 40, 48, 58, and 66) has a DC voltage value such as ground, positive three, or positive five will be stated if that distinction is required. Those of ordinary skill in the art will realize that IC 10 is unlikely to have as many power pins as are shown here. The large number of power pins shown here is in the interest of providing a flexible example, there is no requirement that IC 10 have this many power pins or that they exhibit the alternating pattern shown here to perform the present invention.

In general, the techniques involved in performing DC parametric tests are well known to those of ordinary skill in the art. The particular techniques used will depend on the design of the IC. A common set of techniques is described in the IEEE 1149.1 standard for JTAG BSRs.

Turning now to FIG. 2, a flow diagram of the steps of a conventional VIL test is shown. The conventional VIL test starts at step 80. Next, at step 82, all of the bidirectional outputs are disabled while all of the inputs are held at their initial value, whatever that initial value might be. Next, at step 84, a logic 0 is applied to all of the inputs simultaneously. Next, at step 86, the values that result from the application of logic 0 to all of the inputs is captured into the BSR. Next, at step 88, the contents of the BSR are shifted out while the BSR output pin is strobed for the expected values. Any value at the BSR output pin that is not as expected may indicate a problem and a failure of this test. The conventional VIL test ends at step 90.

Returning to FIG. 1, an example of the conventional VIL test shown in FIG. 2 will be illustrated. The conventional VIL test starts at step 80 of FIG. 2. Then, at step 82 of FIG. 2, bidirectional output buffer 18 is disabled by loading a disable value into bidirectional output enable BS cell 22 while the inputs at pins 26 and 54 are held at their initial value. Then, at step 84 of FIG. 2, a logic 0 is applied to input pins 26 and 54 simultaneously. Then, at step 86 of FIG. 2, the values that result from the application of logic 0 to input pins 26 and 54 is captured into the BS cells (28 and 50 respectively) of the BSR. Then, at step 88 of FIG. 2, the contents of the BS cells of the BSR are shifted out while the BSR output pin 68 is strobed for the expected value. The conventional VIL test ends at step 90 of FIG. 2.

Turning now to FIG. 3, a flow diagram of the steps of a conventional VIH test is shown. The conventional VIH test starts at step 92. Next, at step 94, all of the bidirectional outputs are disabled while all of the inputs are held at their initial value. Next, at step 96, a logic 1 is applied to all of the inputs simultaneously. Next, at step 98, the values that result from the application of logic 1 to all of the inputs is captured into the BSR. Next, at step 100, the contents of the BSR are shifted out while the BSR output pin is strobed for the expected values. The conventional VIH test ends at step 102.

An example of the conventional VIH test shown in FIG. 3 would be similar to the example illustrated for FIG. 2 above except that a logic 1 rather than a logic 0 is applied to input pins 26 and 54 at step 96 of FIG. 3.

Turning now to FIG. 4, a flow diagram of the steps of a conventional VOL test is shown. The conventional VOL test starts at step 104. Next, at step 106, all of the bidirectional input pins are floated externally. Next, at step 108, a logic 0 is loaded into all output BS cells and an output enabling value is loaded into all enable BS cells. Next, at step 110, the outputs are driven and the output pins are strobed for the expected value. The conventional VOL test ends at step 112.

Returning to FIG. 1, an example of the conventional VOL test shown in FIG. 4 will be illustrated. The conventional VOL test starts at step 104 of FIG. 4. Then, at step 106 of FIG. 4, bidirectional input pin 26 is externally floated. Then, at step 108 of FIG. 4, a logic 0 is loaded into output BS cells 16, 34, 42, and 60 and output enabling values are loaded into enable BS cells 22 and 56. Then, at step 110 of FIG. 4, the outputs are driven and pins 24, 38, 46 and 64 are strobed for the expected value. The conventional VOL test ends at step 112 of FIG. 4.

Turning now to FIG. 5, a flow diagram of the steps of a conventional VOH test is shown. The conventional VOH test starts at step 114. Next, at step 116, all of the bidirectional input pins are floated externally. Next, at step 118, a logic 1 is loaded into all output BS cells and an output enabling value is loaded into all enable BS cells. Next, at step 120, the outputs are driven and the output pins are strobed for the expected value. The conventional VOH test ends at step 122.

An example of the conventional VOH test shown in FIG. 5 would be similar to the example illustrated for FIG. 4 above except that a logic 1 rather than a logic 0 is loaded into output BS cells 16, 34, 42, and 60 at step 118 of FIG. 5.

Those of ordinary skill in the art will realize that when a conductor is switched from a logic 0 to a logic 1 or vice versa, the actual voltage on the conductor undergoes oscillations, called transients, before settling down to its final value. The amount of time, called the time constant, that it takes for these transients to settle down will depend on the amount of current involved in the switching and the values of the resistance, inductance, and capacitance (RLC) of the parasitic circuit formed by the conductor and its neighboring devices. The amplitude of these transients is directly related to the amount of current involved in the switching such that the greater the amount of current then the greater the amplitude.

In an IC, ground bounce, also called simultaneous switching noise and delta I noise, is the transient that occurs due to the presence of parasitic RLC circuits. With higher switching frequencies and smaller device dimensions, the parasitic RLC circuits can cause transients to appear on the power and ground rails. If the amplitude of these transients, either individually or in combination, is great enough, the IC may experience a malfunction and/or the DC parametric tests may be invalidated. Test invalidation may occur despite the fact that the IC under test could operate properly in its target environment because automatic test equipment (ATE) is generally more sensitive than the target environment for the IC. The magnitude of the ground bounce may depend on whether the conductor is being switched from logic 0 to logic 1 or vice versa. In either case, it is therefore important to control the generation of ground bounce when performing DC parametric tests.

Turning now to FIG. 6, a schematic of a CMOS inverter having modeled parasitic RLC circuits is shown. CMOS inverter 130 includes transistors 134 and 136 connected as shown between the core logic (not shown) of the IC and bonding pad 138. CMOS inverter 130 is shown further connected to power rail 140 (VDD) and ground rail 142. Those of ordinary skill in the art will realize that the CMOS inverter shown here is only one of many possible I/O buffers that are available and that the principles of ground bounce explained with respect to the CMOS inverter apply similarly to the other possible I/O buffers. CMOS inverter 130 is shown with model parasitic RLC circuit 144 connected between CMOS inverter 130 and power rail 140. Likewise, model parasitic RLC circuit 146 is connected between CMOS inverter 130 and bonding pad 138 and model parasitic RLC circuit 148 is connected between CMOS inverter 130 and ground rail 142.

Based on FIG. 6, ground bounce will occur when CMOS inverter 130 is switched from low to high or vice versa. For example, when CMOS inverter 130 is switched from low to high, the current drawn from power rail 140 causes parasitic RLC circuit 144 to oscillate. While the voltage value at power rail 140 remains constant, the voltage value at the point between parasitic RLC circuit 144 and CMOS inverter 130 goes through transients before settling down to essentially the same voltage value as that at power rail 140. It is ground bounce such as this that should be controlled when performing DC parametric tests.

One method of controlling the ground bounce generated during DC parametric tests is to employ IC design techniques that reduce the parasitic RLC circuits. These IC design techniques include increasing the width of the power and ground rails, having multiple power and ground rails, adding extra power and ground pins to evenly share the switching current, adding unequal delay paths to stagger switching times, and using output buffers with controlled or slow switching. Among the drawbacks to these IC design techniques are first that they are only available to one who is responsible for the IC design and are not available during testing of the IC and second that they are not always sufficient by themselves since the operations performed by a circuit during test may not be anticipated by the IC designers.

A second method of controlling the ground bounce generated during DC parametric tests is to perform the tests on a trial and error basis. That is, run one of the tests, if the test is invalid or causes damage to the IC then determine at which step in the test the problem occurred and redesign that step in the test. Through repetition of this process, eventually specific tests will be formulated. Among the drawbacks to this trial and error method is that time may be wasted running invalid tests and ICs may have to be sacrificed before specific tests are formulated. With the drive to higher integration densities and larger ICs, the cost associated with this method can be unacceptable.

OBJECTS AND ADVANTAGES OF THE INVENTION

Accordingly, it is an object of the present invention to provide a method of controlling ground bounce during DC parametric tests that is available during testing of the IC and that is always sufficient by itself.

It is a further object of the present invention to provide a method of controlling ground bounce during DC parametric tests that substantially eliminates the running of invalid tests and the sacrifice of ICs in the formulation of specific tests.

These and many other objects and advantages of the present invention will become apparent to those of ordinary skill in the art from a consideration of the drawings and ensuing description of the invention.

SUMMARY OF THE INVENTION

The method of controlling ground bounce during DC parametric tests disclosed herein is based on the formulation of tests that best achieve two broad goals. The first goal is to reduce the number of I/O pins that are switched simultaneously. In the formulation of the VIL and VIH tests this goal is implemented by preferably only switching one input at a time. The second goal is to simultaneously switch I/O pins that are distant from one another. In the formulation of the VOL and VOH tests this goal is implemented by partitioning the outputs into subsets and selecting preferably one and only one output at a time from each and every subset.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The method of controlling ground bounce during DC parametric tests disclosed herein is based on the formulation of tests that best achieve two broad goals. The first goal is to reduce the number of I/O pins that are switched simultaneously. In the extreme case, only one I/O pin is switched. While this can be done quite easily for the input tests, it is not always feasible for the output tests. This is in part because there is a tradeoff between the number of output pins switched simultaneously and the total test time. The second goal is to simultaneously switch I/O pins that are distant from one another. In the best case, both physical distance and the electrical characteristics of the I/O pins are considered. This is because the electrical characteristics of the I/O pins are a true measure of how much influence different I/O buffers have on power and ground pins when switching. In the worst case, physical distance is considered alone as a rough indication of the amount of influence a particular I/O buffer has.

In the formulation of the input tests of the present invention disclosed below with respect to FIGS. 7 and 8, the goal of reducing the number of simultaneously switched pins is possible with a negligible increase in the total test time. Unfortunately, the increase in the total test time needed to achieve this goal is unacceptable for the output tests. Accordingly, in the formulation of the output tests of the present invention disclosed below with respect to FIGS. 9, 10, 11, and 12, the goal of simultaneously switching I/O pins that are distant from one another becomes more dominant.

Figure 7:
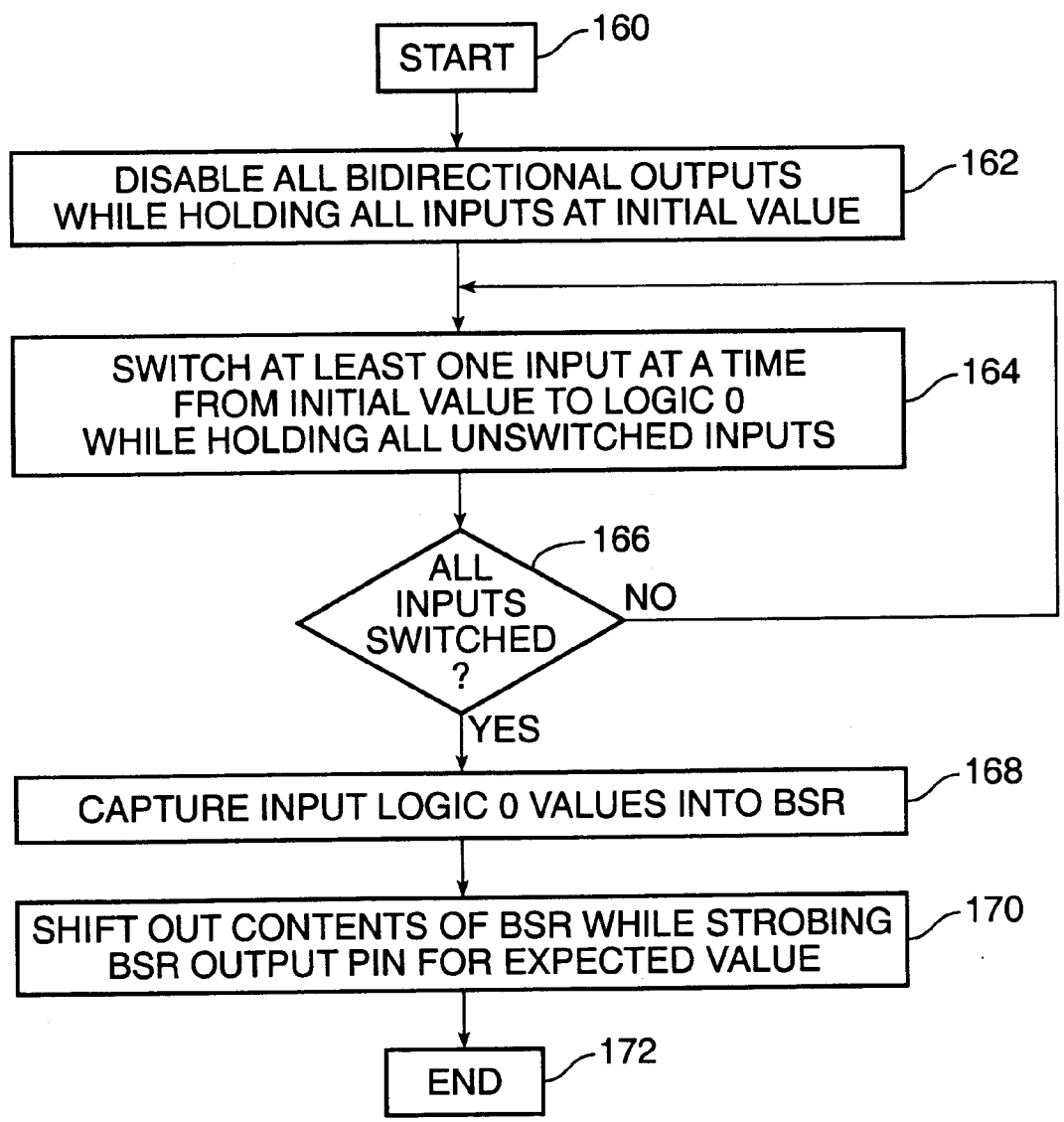
FIG. 7 is a flow diagram of the steps of an enhanced VIL test.

Turning now to FIG. 7, a flow diagram of the steps of an enhanced VIL test is shown. The enhanced VIL, test starts at step 160. Next, at step 162, all of the bidirectional outputs are disabled while holding all of the inputs at their initial value. Next, at step 164, at least one input is switched from its initial value to logic 0 while all of the other inputs are held in their switched or initial state. Next, at step 166, a determination is made as to whether all of the inputs have been switched from their initial state to logic 0. If not, the test returns to step 164. The result is that inputs that have been switched stay switched and that additional inputs are switched through the repetition of steps 164 and 166 until all of the inputs have been switched. Preferably, only one input at a time is switched, but more than one could also be switched. However, the more inputs that are switched simultaneously, the less the first goal above is realized. Eventually, at step 166, a determination is made that all of the inputs have been switched and the test advances to step 168. At step 168, the values that result from the application of logic 0 to all of the inputs is captured into the BSR. Next, at step 170, the contents of the BSR are shifted out while the BSR output pin is strobed for the expected values. The enhanced VIL test ends at step 172.

Figure 1:
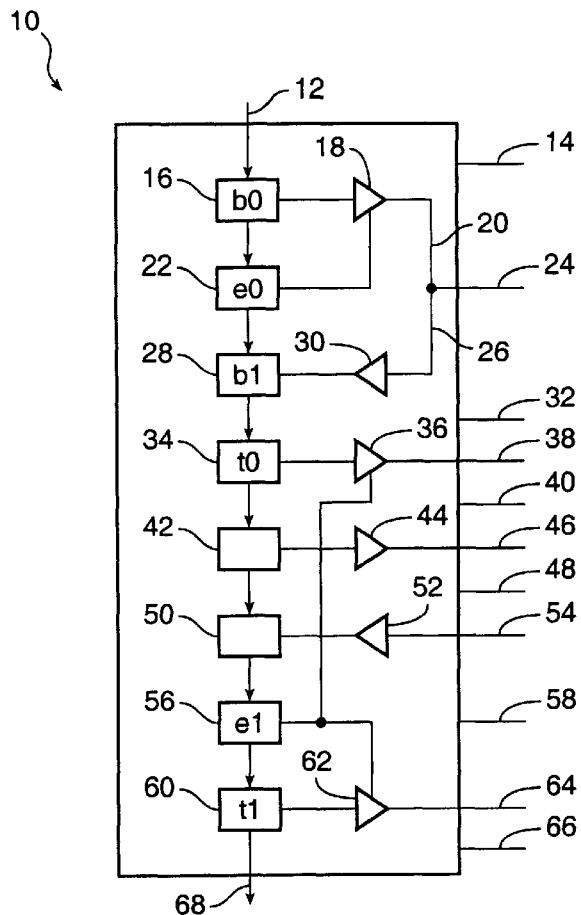
FIG. 1 is a block diagram of an IC having a BSR.
Figure 2:
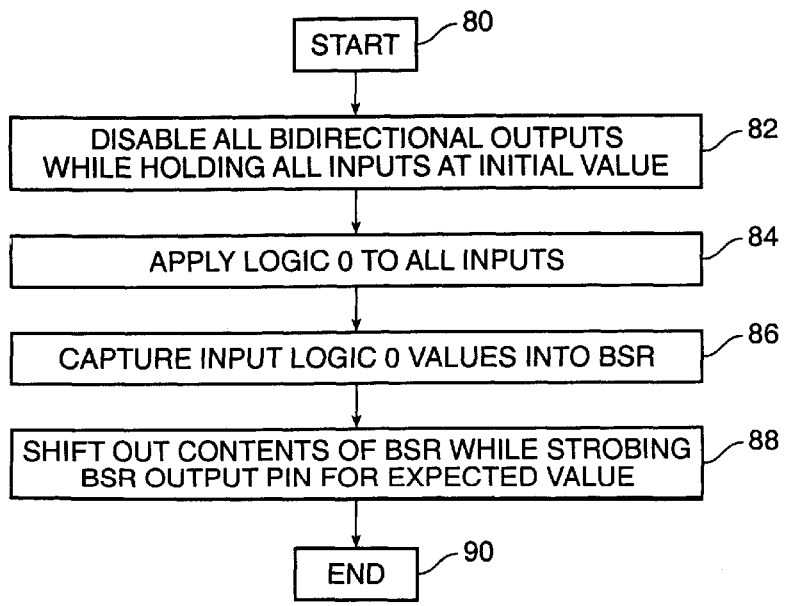
FIG. 2 is a flow diagram of the steps of a conventional VIL test.
Figure 3:
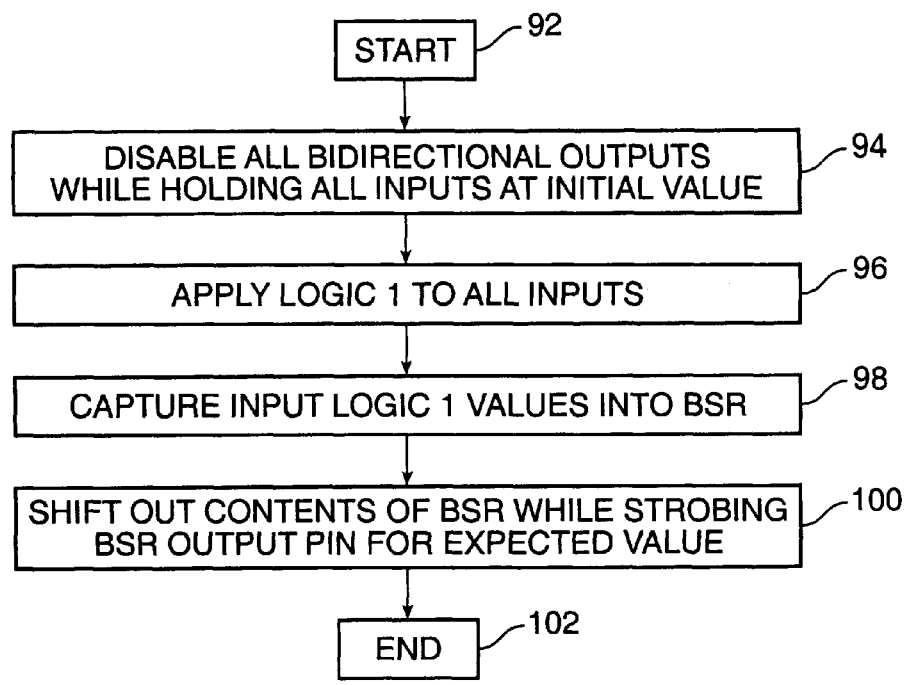
FIG. 3 is a flow diagram of the steps of a conventional VIH test.
Figure 4:
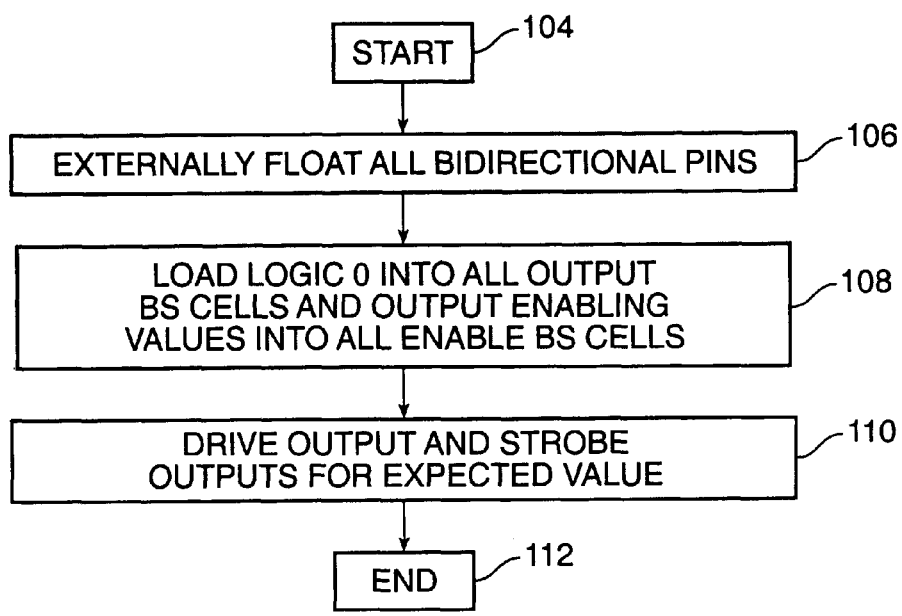
FIG. 4 is a flow diagram of the steps of a conventional VOL test.
Figure 5:
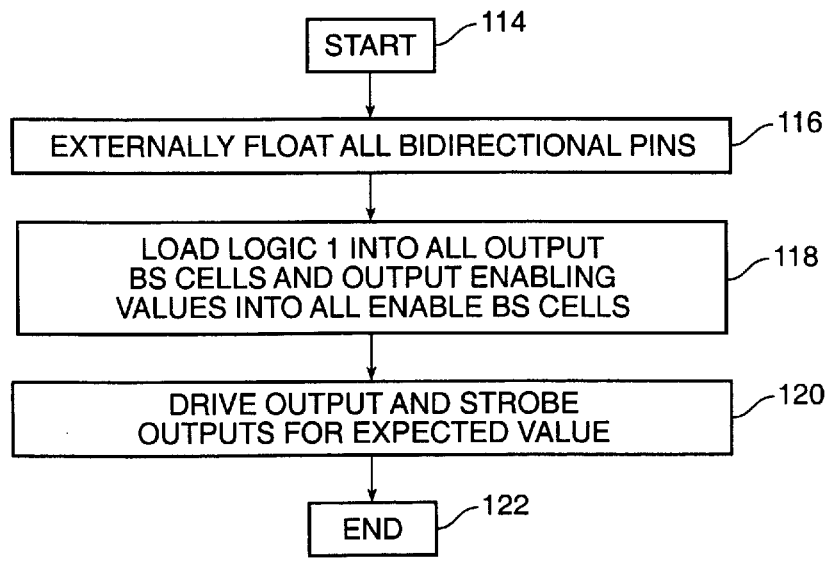
FIG. 5 is a flow diagram of the steps of a conventional VOH test.
Figure 6:
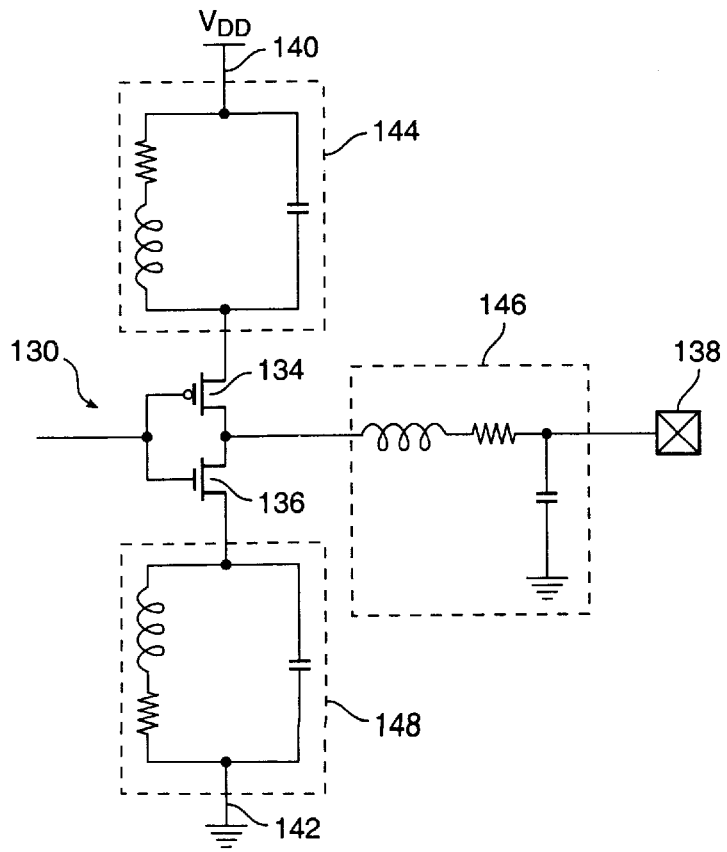
FIG. 6 is a schematic of a CMOS inverter having modeled parasitic RLC circuits.

Returning to FIG. 1, an example of the enhanced VIL test shown in FIG. 7 will be illustrated. Each of the examples that follow with respect to FIGS. 7–12 will be directed to a preferred embodiment of the present invention unless otherwise noted. The enhanced VIL test starts at step 160 of FIG. 7. Then, at step 162 of FIG. 7, the bidirectional output buffer 18 is disabled while pins 24 and 54 are held at their initial value. Then, at step 164 of FIG. 7, a logic 0 is applied to pin 24 while input pin 54 is held at its initial value. Then, at step 166 of FIG. 7, a determination is made that input pin 54 has not been switched and the test returns to step 164. Then, at step 164, a logic 0 is applied to input pin 54 while a logic 0 is held on pin 24. Then, at step 166, a determination is made that all of the input pins have been switched and the test advances to step 168 of FIG. 7. At step 168, the values that result from the application of logic 0 to pins 24 and 54 is captured into the BS cells (28 and 50) of the BSR. Then, at step 170 of FIG. 7, the contents of the BS cells of the BSR are shifted out while the BSR output pin 68 is strobed for the expected value. The enhanced VIL test ends at step 172 of FIG. 7.

Figure 8:
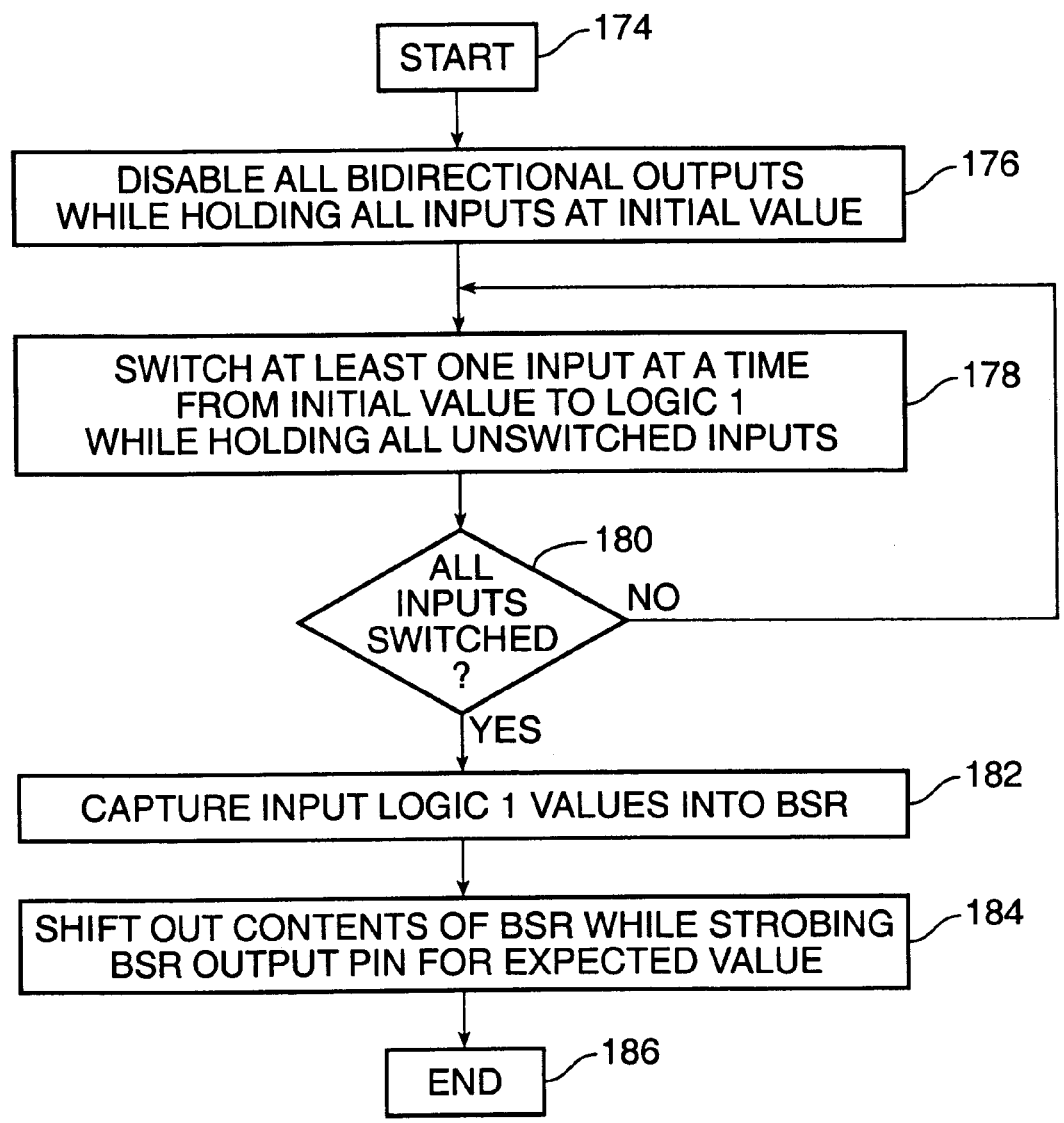
FIG. 8 is a flow diagram of the steps of an enhanced VIH test.

Turning now to FIG. 8, a flow diagram of the steps of an enhanced VIH test is shown. The enhanced VIH test starts at step 174. Next, at step 176, all of the bidirectional outputs are disabled while holding all of the inputs at their initial value. Next, at step 178, at least one input is switched from its initial value to logic 1 while all of the other inputs are held in their switched or initial state. Next, at step 180, a determination is made as to whether all of the inputs have been switched from their initial state to logic 1. If not, the test returns to step 178. The result is that inputs that have been switched stay switched and that additional inputs are switched through the repetition of steps 178 and 180 until all of the inputs have been switched. Preferably, only one input at a time is switched, but more than one could also be switched. However, the more inputs that are switched simultaneously, the less the first goal above is realized. Eventually, at step 180, a determination is made that all of the inputs have been switched and the test advances to step 182. At step 182, the values that result from the application of logic 1 to all of the inputs is captured into the BSR. Next, at step 184, the contents of the BSR are shifted out while the BSR output pin is strobed for the expected values. The enhanced VIH test ends at step 186.

An example of the enhanced VIH test shown in FIG. 8 would be similar to the example illustrated for FIG. 7 above except that the pins 24 and 54 have a logic 1 rather than a logic 0 successively applied through the repetition of steps 178 and 180 of FIG. 8.

Recall from above that the goal of reducing the number of simultaneously switched pins to the ideal of one at a time may be unacceptable for the output tests due to the increase in the total test time needed to achieve this goal. The increase in the total test time that would result is proportional to the square of the length of the BSR in terms of the number of BS cells and the number of outputs. Accordingly, in the formulation of the output tests, the goal of simultaneously switching I/O pins that are distant from one another becomes more dominant. Furthermore, it may not be possible to only switch one output at a time such as in the case when several 3-state output pins are controlled by a single enable BS cell.

In addition to these competing goals, in the case of the output tests, their formulation depends on how much information is known about the particular IC for which the tests are being formulated. At the most, the desired information includes the amount of current sourced or sunk by, the location of, and the type of the output and power pins. At the least, the desired information includes the ordering of the output BS cells. The amount of knowledge that is available can be broken down into three cases. First, in Case 1 (C1), it is assumed that all of the desired information is known. Second, in Case 2 (C2), it is assumed that only the location of and the type of the input, output, and power pins are known. Third, in Case 3 (C3), it is assumed that only the ordering of the BS cells is known. In C3 it is further assumed that the ordering of the BS cells reflects the ordering of the pins that are connected to them.

The amount of knowledge represented in these three cases gives one an indication of the likelihood of achieving the second goal above in the formulation of the output tests. In C1, all of the knowledge that is needed to determine the influence of a particular I/O buffer is known and achieving the second goal is substantially certain. In C2, only physical distances are known and considered as a rough indication of the influence of different I/O buffers and achieving the second goal is somewhat less certain. In C3, physical distances are assumed and achieving the second goal is even less certain. Consequently, the more information that can be made available the greater the likelihood of success. Nevertheless, in any of C1, C2, and C3 above, the possibility of not achieving the second goal is considered low enough to represent an acceptable risk and represents a substantial improvement over the pure trial and error method outlined above.

In further addition to the competing goals and how much information is known about the particular IC, in the case of the output tests, their formulation depends on the state in which the outputs are at the beginning of the tests. The 3-state outputs may either be in a Z state or in a state other than a Z state. The formulation of the output tests requires more steps if the 3-state outputs are in the Z state than if the outputs are in a state other than a Z state as will be outlined below with respect to FIGS. 9, 10, 11, and 12.

Figure 9:
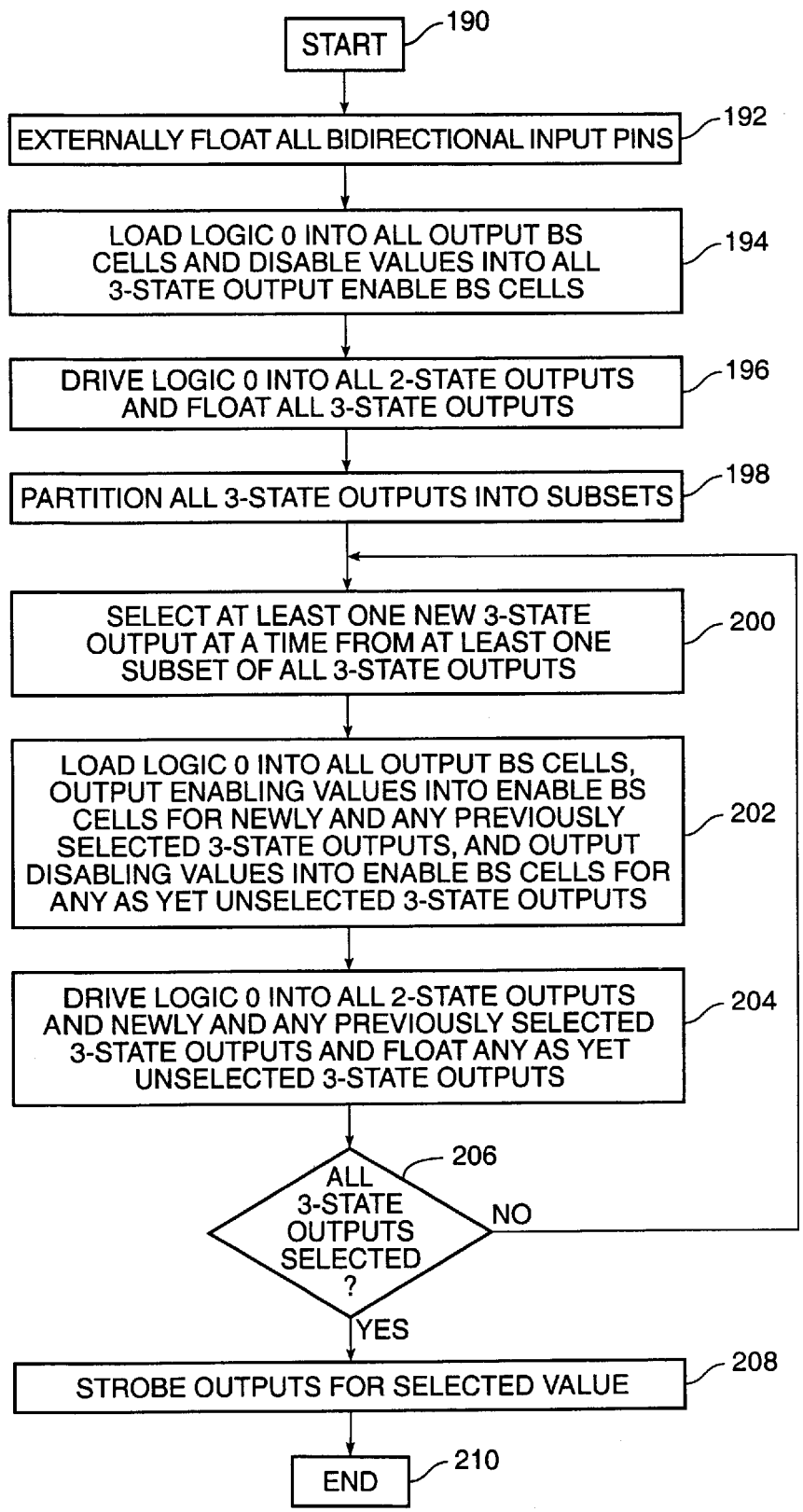
FIG. 9 is a flow diagram of the steps of an enhanced VOL test beginning with all of the 3-state outputs in the Z state.

Turning now to FIG. 9, a flow diagram of the steps of an enhanced VOL test beginning with all of the 3-state outputs in the Z state is shown. The enhanced VOL test begins at step 190. Next, at step 192, all of the bidirectional input pins are floated externally. Next, at step 194, a logic 0 is loaded into all output BS cells and an output disabling value is loaded into all 3-state output enable BS cells. Next, at step 196, a logic 0 is driven into all 2-state outputs and all 3-state outputs are floated.

Next, at step 198, all 3-state outputs are partitioned into subsets. How the 3-state outputs are partitioned at step 198 will depend on which case (C1, C2, or C3 above) one is working under. For the VOL test, the locations of the ground pins are used in partitioning the 3-state outputs into subsets. Under both C1 and C2, the location of the ground pins are known. Under C3, the first pin that is neither assumed to be an input nor an output pin is assumed to be a ground pin. Then, if the average number of 3-state output pins between consecutive ground pins is known, one starts with the next 3-state output pin and counts down this average number of 3-state output pins, counting only 3-state output pins, and the next pin after that that is neither an input nor an output pin is also assumed to be a ground pin. The rest of the ground pins are determined by repeating this count until the end is reached. Alternatively, if the maximum number of 3-state output pins that can be switched is known, one takes the total number of 3-state output pins and divides that by this maximum and, starting with the next 3-state output pin, counts down the product and the next pin after that that is neither an input nor an output pin is also assumed to be a ground pin. The rest of the ground pins are determined by repeating this count until the end is reached. With the location of the ground pins identified, the 3-state outputs are partitioned into subsets. A subset is defined as those 3-state outputs which are between consecutive ground pins.

Next, at step 200, at least one new 3-state output at a time from at least one subset of all 3-state outputs is selected. Preferably, one and only one 3-state output at a time is selected from each and every subset, but more than one could also be selected or may have to be selected depending on the circumstances. However, the more 3-state outputs that are selected simultaneously, the less the second goal above may be achieved. How the 3-state outputs are selected at step 200 will depend on which case one is working under. Under C1, the ground bounce generated by each 3-state output is determined. The desired maximum ground bounce is also determined. Then, within each and every subset, the 3-state outputs are selected by choosing those 3-state outputs that when taken together do not have a total ground bounce that exceeds the maximum ground bounce. Since the actual ground bounce is known, more than one 3-state output can be selected within each subset and the physical location of the 3-state output within the subset is not considered. Under both C2 and C3, ideally one and only one 3-state output at a time is selected from each and every subset. If however, a 3-state output enable BS cell is for more than one 3-state output in a subset, then all of the 3-state outputs for that enable BS cell will have to be selected in that subset.

Next, at step 202, a logic 0 is loaded into all output BS cells, output enabling values are loaded into enable BS cells for all newly and any previously selected 3-state outputs, and output disabling values are loaded into enable BS cells for any as yet unselected 3-state outputs. Next, at step 204, a logic 0 is driven into all 2-state outputs and all newly and previously selected 3-state outputs and any as yet unselected 3-state outputs are floated. Next, at step 206, a determination is made as to whether all of the 3-state outputs have been selected. If not, the test returns to step 200. The result is that 3-state outputs that have been selected stay selected and that additional 3-state outputs are selected through the repetition of steps 200, 202, and 204 until all of the 3-state outputs have been selected. Eventually, at step 206, a determination is made that all of the 3-state outputs have been selected and the test advances to step 208. Next, at step 208, the outputs are strobed for the expected values. The enhanced VOL test ends at step 210.

Returning to FIG. 1, examples of the enhanced VOL test shown in FIG. 9 will be illustrated. Since the formulation of the test depends on which case one is operating under, three examples will be given. First, assume that pins 14, 40, and 66 are ground pins and that 3-state output buffers 18, 36, and 62 have specific scalar quantification of ground bounce values of 3, 5, and 4 respectively. Further assume that the maximum scalar quantification of ground bounce is 6. Given this pin layout and these ground bounce values, the enhanced VOL test for C1 starts at step 190 of FIG. 9. Then, at step 192 of FIG. 9, the bidirectional pin 24 is floated externally. Then, at step 194 of FIG. 9, a logic 0 is loaded into output BS cells 16, 34, 42, and 60 and output disabling values are loaded into 3-state output enable BS cells 22 and 56. Then, at step 196 of FIG. 9, a logic 0 is driven into 2-state output buffer 44 and 3-state output buffers 18, 36, and 62 and 3-state output buffers 18, 36, and 62 are floating.

Then, at step 198 of FIG. 9, the 3-state output buffers 18, 36, and 62 are partitioned into subsets. In this C1 example, there are only two subsets. Subset one (S1) is between consecutive ground pins 14 and 40 and contains 3-state output buffers 18 and 36. Subset two (S2) is between consecutive ground pins 40 and 66 and contains state output buffer 62.

Then, at step 200 of FIG. 9, at least one 3-state output is selected from each and every subset. In this C1 example, the maximum ground bounce is 6. Looking first to S1, 3-state output buffer 18 has a ground bounce of 3 and 3-state output buffer 36 has a ground bounce of 5 for a total of 8. This total ground bounce for S1 is too large so only one of the two 3-state outputs can be selected at this time. Either one could be selected but one must consider other factors first. Looking now to S2, there is only one 3-state output buffer in the subset so 3-state output buffer 62 is selected. Since 3-state output buffer 62 is selected from S2 and 3-state output buffer 36 has the same 3-state output enable BS cell (56), it becomes desirable to select 3-state output buffer 36 and not 3-state output buffer 18 from S1.

Then, at step 202 of FIG. 9, a logic 0 is loaded into output BS cells 16, 34, 42, and 60, an output enabling value is loaded into output enable BS cell 56, and an output disabling value is loaded into output enable BS cell 22. Then, at step 204 of FIG. 9, a logic 0 is driven into 2-state output buffer 44 and 3-state output buffers 36 and 62. 3-state output buffer 18 remains floating. Then, at step 206 of FIG. 9, a determination is made that 3-state output buffers 36 and 62 have been selected and 3-state output buffer 18 has not been selected so the test returns to step 200 of FIG. 9. Then, at step 200, the only remaining 3-state output buffer 18 is selected. Then, at step 202, a logic 0 is loaded into output BS cells 16, 34, 42, and 60 and output enabling values are loaded into output enable BS cells 22 and 56. Then, at step 204, a logic 0 is driven into 2-state output buffer 44 and 3-state output buffers 18, 36 and 62. Then, at step 206, a determination is made that all of the 3-state output buffers have been selected so the test advances to step 208 of FIG. 9. Then, at step 208, the pins 24, 38, 46, and 64 are strobed for the expected values. The enhanced VOL test ends at step 210 of FIG. 9.

Second, assume for purposes of a C2 example that pins 14, 40, and 66 are ground pins. Given this pin layout, the enhanced VOL test for C2 starts at step 190 of FIG. 9. Then, at step 192 of FIG. 9, the bidirectional pin 24 is floated externally. Then, at step 194 of FIG. 9, a logic 0 is loaded into output BS cells 16, 34, 42, and 60 and output disabling values are loaded into 3-state enable BS cells 22 and 56. Then, at step 196 of FIG. 9, a logic 0 is driven into 2-state output buffer 44 and 3-state output buffers 18, 36, and 62 and 3-state output buffers 18, 36, and 62 are floating.

Then, at step 198 of FIG. 9, the 3-state output buffers 18, 36, and 62 are partitioned into subsets. In this C2 example, there are only two subsets. S1 is between consecutive ground pins 14 and 40 and contains 3-state output buffers 18 and 36. S2 is between consecutive ground pins 40 and 66 and contains 3-state output buffer 62.

Then, at step 200 of FIG. 9, at least one 3-state output buffer is selected from each and every subset. In this C2 example, the ground bounce values are unknown so only one 3-state output from each subset is selected whenever possible. Looking first to S1, it is not necessary to select both 3-state output buffers 18 and 36 so either could be selected but one must consider other factors first. Looking now to S2, there is only one 3-state output buffer in the subset so 3-state output buffer 62 is selected. Since 3-state output buffer 62 is selected from S2 and 3-state output buffer 36 has the same output enable BS cell (56), it becomes desirable to select 3-state output buffer 36 and not 3-state output buffer 18 from S1.

Then, at step 202 of FIG. 9, a logic 0 is loaded into output BS cells 16, 34, 42, and 60, an output enabling value is loaded into output enable BS cell 56, and an output disabling value is loaded into output enable BS cell 22. Then, at step 204 of FIG. 9, a logic 0 is driven into 2-state output buffer 44 and 3-state output buffers 36 and 62. 3-state output buffer 18 remains floating. Then, at step 206 of FIG. 9, a determination is made that 3-state output buffers 36 and 62 have been selected and 3-state output buffer 18 has not been selected so the test returns to step 200 of FIG. 9. Then, at step 200, the only remaining 3-state output buffer 18 is selected. Then, at step 202, a logic 0 is loaded into output BS cells 16, 34, 42, and 60 and output enabling values are loaded into output enable BS cells 22 and 56. Then, at step 204, a logic 0 is driven into 2-state output buffer 44 and 3-state output buffers 18, 36 and 62. Then, at step 206, a determination is made that all of the 3-state output buffers have been selected so the test advances to step 208 of FIG. 9. Then, at step 208, the output pins 20, 38, 46, and 64 are strobed for the expected values. The enhanced VOL test ends at step 210 of FIG. 9.

Third, assume for purposes of a C3 example that BS cell 16 is a bidirectional output, that BS cell 22 is a bidirectional output enable, that BS cell 28 is a bidirectional input, that BS cell 42 is a 2-state output, and that BS cell 50 is an input. BS enable cell 56 is for 3-state output BS cells 34 and 60 as shown. From this, it is assumed that these BS cells are connected to pins 24, 26, 38, 46, 54, and 64 as shown. Given this assumed pin layout, the enhanced VOL test for C3 starts at step 190 of FIG. 9. Then, at step 192 of FIG. 9, the bidirectional pin 24 is floated externally. Then, at step 194 of FIG. 9, a logic 0 is loaded into output BS cells 16, 34, 42, and 60 and output disabling values are loaded into 3-state enable BS cells 22 and 56. Then, at step 196 of FIG. 9, a logic 0 is driven into pins 46, 24, 38, and 64 and pins 24, 38, and 64 are floating.

Then, at step 198 of FIG. 9, the 3-state outputs 24, 38, and 64 are partitioned into subsets. In this C3 example, the location of the ground pins is unknown and is assumed in one of two ways. In either way, pin 14 is assumed to be a ground pin. In the first way, if the average number of output pins between consecutive ground pins is known to be 2, one counts down 2 and the first pin after that that is neither an input nor an output is also assumed to be a ground pin. The rest of the ground pins are determined by repeating this count until the end is reached. In the second way, if the maximum number of pins that can be switched is known to be 2, one takes the total number of output pins 4 and divides that by 2 and counts down 2 and the first pin after that that is neither an input nor an output is also assumed to be a ground pin. The rest of the ground pins are determined by repeating this count until the end is reached. In either way, it turns out here that pins 40 and 66 are also assumed to be ground pins. In this C3 example, there are only two subsets. S1 is between consecutive ground pins 14 and 40 and contains pins 24 and 38. S2 is between ground pins 40 and 66 and contains pin 64.

Then, at step 200 of FIG. 9, at least one pin is selected from each and every subset. In this C3 example, the ground bounce values are unknown so only one 3-state output from each subset is selected whenever possible. Looking first to S1, it is not necessary to select both pins 24 and 38 so either could be selected and thus assume that pin 38 is selected. Looking now to S2, there is only one pin in the subset so pin 64 is selected.

Then, at step 202 of FIG. 9, a logic 0 is loaded into output BS cells 16, 34, 42, and 60, an output enabling value is loaded into output enable BS cell 56, and an output disabling value is loaded into output enable BS cell 22. Then, at step 204 of FIG. 9, a logic 0 is driven into pins 46, 38, and 64. Pin 18 remains floating. Then, at step 206 of FIG. 9, a determination is made that pins 38 and 64 have been selected and pin 24 has not been selected so the test returns to step 200 of FIG. 9. Then, at step 200, the only remaining pin 24 is selected. Then, at step 202, a logic 0 is loaded into output BS cells 16, 34, 42, and 60 and output enabling values are loaded into output enable BS cells 22 and 56. Then, at step 204, a logic 0 is driven into pins 24, 46, 38, and 64. Then, at step 206, a determination is made that all of the pins have been selected so the test advances to step 208 of FIG. 9. Then, at step 208, the pins 24, 38, 46, and 64 are strobed for the expected values. The enhanced VOL test ends at step 210 of FIG. 9.

Figure 10:
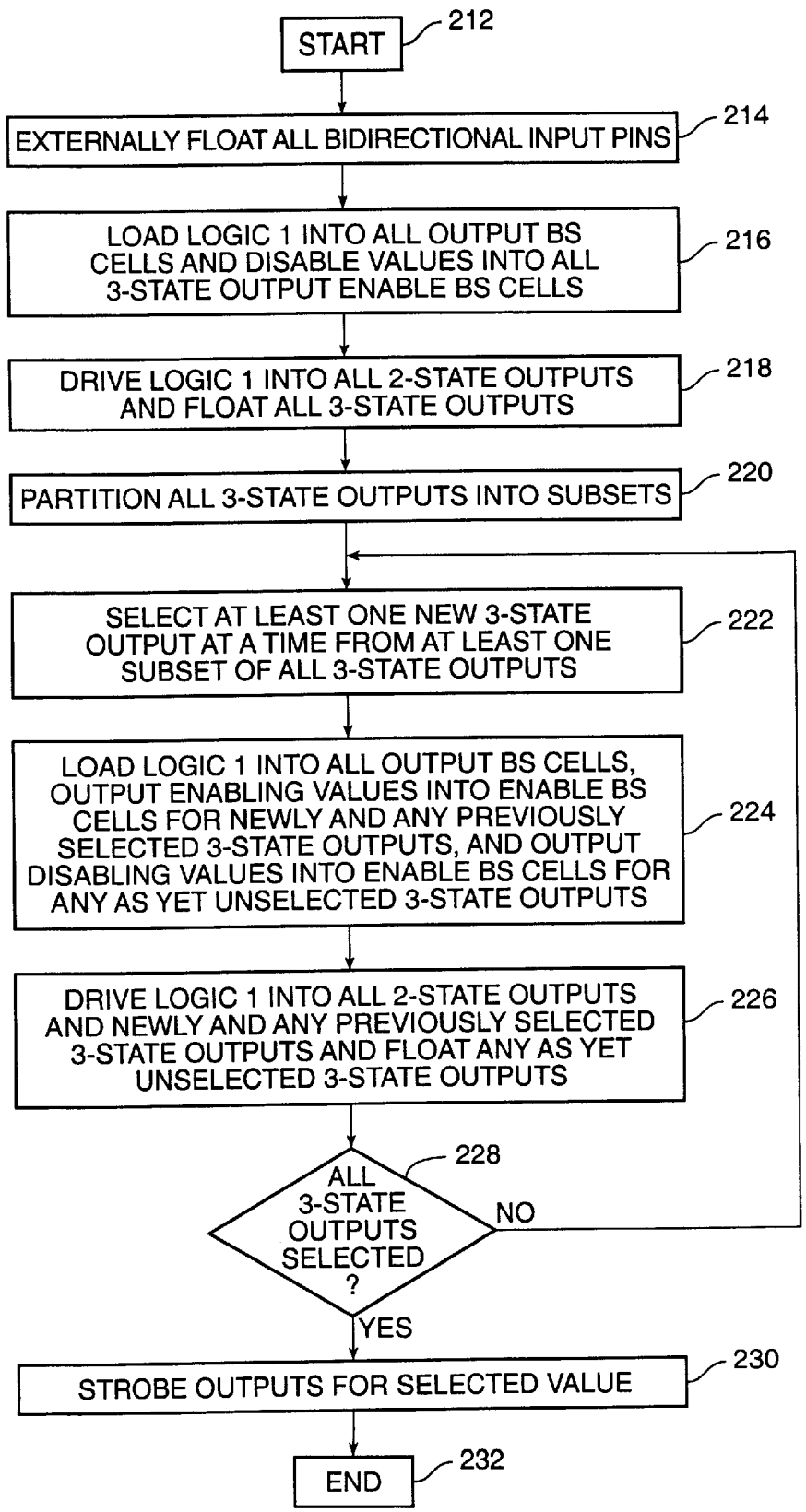
FIG. 10 is a flow diagram of the steps of an enhanced VOH test beginning with all of the 3-state outputs in the Z state.

Turning now to FIG. 10, a flow diagram of the steps of an enhanced VOH test beginning with all of the 3-state outputs in the Z state is shown. The enhanced VOH test begins at step 212. Next, at step 214, all of the bidirectional input pins are floated externally. Next, at step 216, a logic 1 is loaded into all output BS cells and an output disabling value is loaded into all 3-state output enable BS cells. Next, at step 218, a logic 1 is driven into all 2-state outputs and all 3-state outputs are floated.

Next, at step 220, all 3-state outputs are partitioned into subsets. How the 3-state outputs are partitioned at step 220 will depend on which case one is working under. For the VOH test, the locations of the power pins are used in partitioning the 3-state outputs into subsets. Under both C1 and C2, the location of the power pins are known. Under C3, the first pin that is not assumed to be an input or an output pin is assumed to be a power pin. Then, if the average number of 3-state output pins between consecutive power pins is known, one starts with the next 3-state output pin and counts down this average number of 3-state output pins, counting only 3-state output pins, and the next pin after that that is neither an input nor an output pin is also assumed to be a power pin. The rest of the power pins are determined by repeating this count until the end is reached. Alternatively, if the maximum number of 3-state output pins that can be switched is known, one takes the total number of 3-state output pins and divides that by this maximum and, starting with the next 3-state output pin, counts down the product and the next pin after that that is neither an input nor an output pin is also assumed to be a power pin. The rest of the power pins are determined by repeating this count until the end is reached. With the location of the power pins identified, the 3-state outputs are partitioned into subsets. A subset is defined as those 3-state outputs which are between consecutive power pins.

Next, at step 222, at least one new 3-state output at a time from at least one subset of all 3-state outputs is selected. Preferably, one and only one 3-state output at a time is selected from each and every subset, but more than one could also be selected or may have to be selected depending on the circumstances. However, the more 3-state outputs that are selected simultaneously, the less the second goal above may be achieved. How the 3-state outputs are selected at step 222 will depend on which case one is working under. Under C1, the ground bounce generated by each 3-state output is determined. The desired maximum ground bounce is also determined. Then, within each and every subset, the 3-state outputs are selected by choosing those 3-state outputs that when taken together do not have a total ground bounce that exceeds the maximum ground bounce. Since the actual ground bounce is known, more than one 3-state output can be selected within each subset and the physical location of the 3-state output within the subset is not considered. Under both C2 and C3, ideally one and only one 3-state output at a time is selected from each and every subset. If however, a 3-state output enable BS cell is for more than one 3-state output in a subset, then all of the 3-state outputs for that enable BS cell will have to be selected in that subset.

Next, at step 224, a logic 1 is loaded into all output BS cells, output enabling values are loaded into enable BS cells for all newly and any previously selected 3-state outputs, and output disabling values are loaded into enable BS cells for any as yet unselected 3-state outputs. Next, at step 226, a logic 1 is driven into all 2-state outputs and all newly and previously selected 3-state outputs and any as yet unselected 3-state outputs are floated. Next, at step 228, a determination is made as to whether all of the 3-state outputs have been selected. If not, the test returns to step 222. The result is that 3-state outputs that have been selected stay selected and that additional 3-state outputs are selected through the repetition of steps 222, 224, and 226 until all of the 3-state outputs have been selected. Eventually, at step 228, a determination is made that all of the 3-state outputs have been selected and the test advances to step 230. Next, at step 230, the outputs are strobed for the expected values. The enhanced VOH test ends at step 232.

Examples of the enhanced VOH test shown in FIG. 10 would be similar to the examples illustrated for FIG. 9 above except that power pins and not ground pins are used to define the subsets, that a logic 1 rather than a logic 0 is loaded in steps 216 and 224, and that a logic 1 rather than a logic 0 is driven in steps 218 and 226 of FIG. 10.

Figure 11:
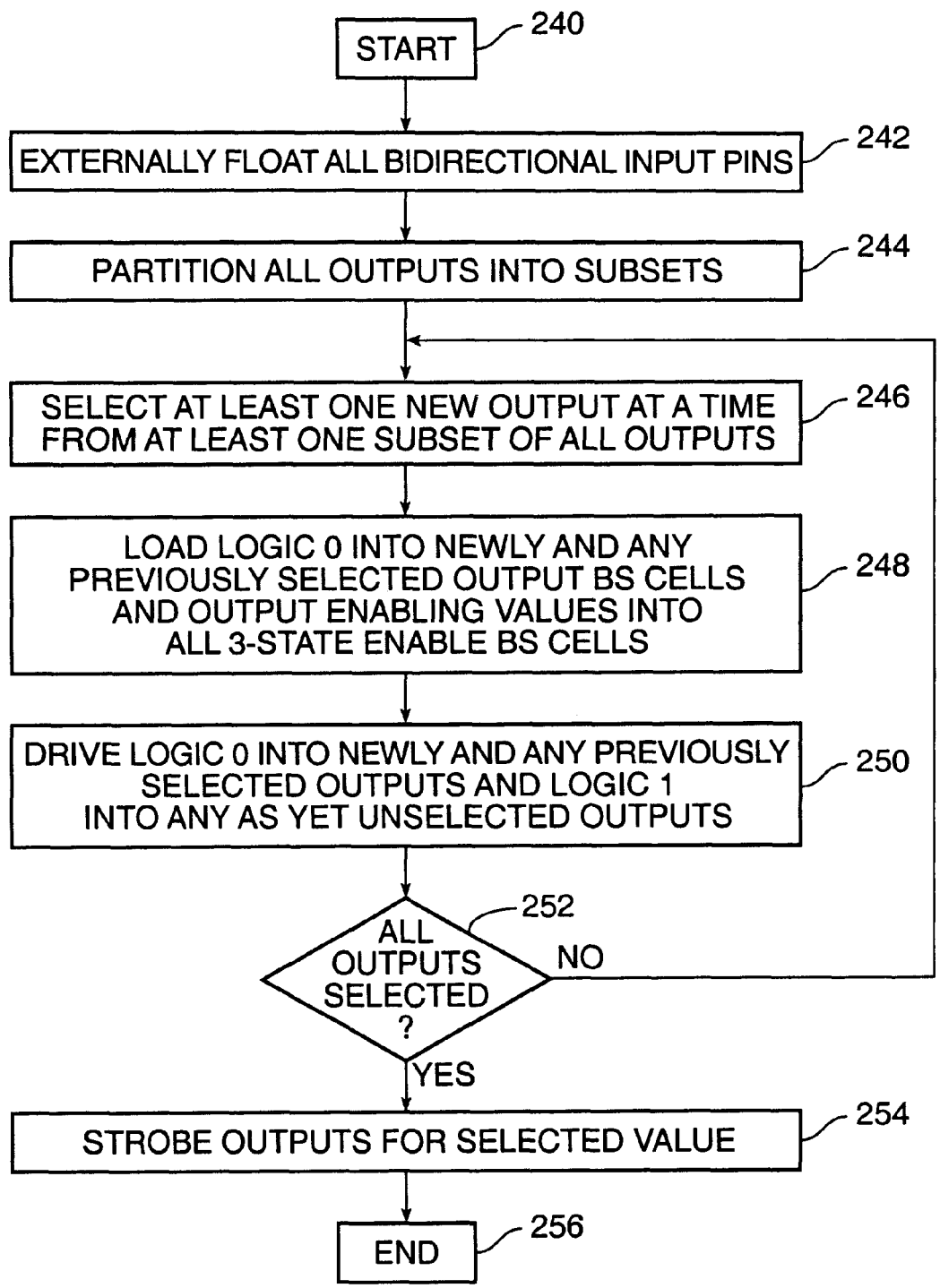
FIG. 11 is a flow diagram of the steps of an enhanced VOL test beginning with all of the outputs in a state other than the Z state.

Turning now to FIG. 11, a flow diagram of the steps of an enhanced VOL test beginning with all of the outputs in a state other than the Z state is shown. Those of ordinary skill in the art will realize that this implies that 3-state enabling values were loaded into all 3-state output enable BS cells. The enhanced VOL test begins at step 240. Next, at step 242, all bidirectional input pins are floated externally.

Next, at step 244, all outputs are partitioned into subsets. How the outputs are partitioned at step 244 will depend on which case one is working under. For the VOL test, the locations of the ground pins are used in partitioning the outputs into subsets. The partitioning process is similar to that outlined for step 198 of FIG. 9 above except that all outputs and not just 3-state outputs are partitioned.

Next, at step 246, at least one new output at a time from at least one subset of all outputs is selected. Preferably, one and only one output at a time is selected from each and every subset, but more than one could also be selected. However, the more outputs that are selected simultaneously, the less the second goal above may be achieved. How the outputs are selected at step 246 will depend on which case one is working under. The selection process is similar to that outlined for step 200 of FIG. 9 above except that all outputs and not just 3-state outputs are selected.

Next, at step 248, a logic 0 is loaded into all newly and any previously selected output BS cells and output enabling values are loaded into all enable BS cells. Next, at step 250, a logic 0 is driven into all newly and any previously selected outputs and a logic 1 is driven into any as yet unselected outputs. Next, at step 268, a determination is made as to whether all of the outputs have been selected. If not, the test returns to step 246. The result is that outputs that have been selected stay selected and that additional outputs are selected through the repetition of steps 246, 248, and 250 until all of the outputs have been selected. Eventually, at step 268, a determination is made that all of the outputs have been selected and the test advances to step 254. Next, at step 254, the outputs are strobed for the expected values. The enhanced VOL test ends at step 256.

Returning to FIG. 1, examples of the enhanced VOL test shown in FIG. 11 will be illustrated. Since the formulation of the test depends on which case one is operating under, three examples will be given. First, assume for purposes of a C1 example that pins 14, 40, and 66 are ground pins. Pins 20, 38, 46, and 64 are outputs as shown and have specific scalar quantification of ground bounce values of 7, 5, 2, and 6 respectively. Further it is assumed that the maximum scalar quantification of ground bounce is 9. Given this pin layout and these ground bounce values, the enhanced VOL test for C1 starts at step 240 of FIG. 1. Then, at step 242 of FIG. 11, the bidirectional pin 24 is floated externally.

Then, at step 244 of FIG. 11, the output buffers 18, 36, 44, and 62 are partitioned into subsets. In this C1 example, there are only two subsets. S1 is between consecutive ground pins 14 and 40 and contains output buffers 18 and 36. S2 is between consecutive ground pins 40 and 66 and contains output buffers 44 and 62.

Then, at step 246 of FIG. 11, at least one output buffer is selected from each and every subset. In this C1 example, the maximum ground bounce is 9. Looking first to S1, output buffer 18 has a ground bounce of 7 and output buffer 36 has a ground bounce of 5 for a total of 12. This total ground bounce for S1 is too large so only one of the two outputs can be selected at this time. Either one could be selected and thus assume that output buffer 18 is selected. Looking now to S2, output buffer 44 has a ground bounce of 2 and output buffer 62 has a ground bounce of 6 for a total of 8. This total ground bounce for S2 is below the maximum so both outputs can be selected and thus assume that output buffers 44 and 62 are selected.

Then, at step 248 of FIG. 11, a logic 0 is loaded into output BS cells 16, 42, and 60 and output enabling values are loaded into output enable BS cells 22 and 56. Then, at step 250 of FIG. 11, a logic 0 is driven into output buffers 18, 44, and 62 and a logic 1 is driven into output buffer 36. Then, at step 252, a determination is made that output buffers 18, 44, and 62 have been selected and that output buffer 36 has not been selected so the test returns to step 246 of FIG. 11. Then, at step 246, the only remaining output buffer 36 is selected. Then, at step 248, a logic 0 is loaded into output BS cells 16, 34, 42, and 60 and output enabling values are loaded into output enable BS cells 22 and 56. Then, at step 250, a logic 0 is driven into output buffers 18, 36, 44, and 62. Then, at step 252, a determination is made that all of the output buffers have been selected so the test advances to step 254 of FIG. 11. Then, at step 254, pins 24, 38, 46, and 64 are strobed for the expected values. The enhanced VOL test ends at step 256 of FIG. 11.

Second, assume for purposes of a C2 example that pins 14, 32, and 66 are ground pins. Given this pin layout, the enhanced VOL test for C2 starts at step 240 of FIG. 11. Then, at step 242 of FIG. 11, the bidirectional pin 24 is floated externally.

Then, at step 244 of FIG. 11, the output buffers 18, 36, 44, and 62 are partitioned into subsets. In this C2 example, there are only two subsets. S1 is between consecutive ground pins 14 and 32 and contains output buffer 18. S2 is between consecutive ground pins 32 and 66 and contains output buffers 36, 44, and 62.

Then, at step 246 of FIG. 11, at least one output buffer is selected from each and every subset. In this C2 example, the ground bounce values are unknown so only one output buffer from each subset is selected whenever possible. Looking first to S1, there is only one output buffer in the subset so output buffer 18 is selected. Looking now to S2, only one of the three output buffers should be selected and thus output buffer 36 is selected.

Then, at step 248 of FIG. 11, a logic 0 is loaded into output BS cells 16 and 34 and output enabling values are loaded into output enable BS cells 22 and 56. Then, at step 250 of FIG. 11, a logic 0 is driven into output buffers 18 and 36 and a logic 1 is driven into output buffers 44 and 62. Then, at step 252, a determination is made that output buffers 18 and 36 have been selected and that output buffers 44 and 62 have not been selected so the test returns to step 246 of FIG. 11. Then, at step 246, either output buffer 44 or 62 could be selected and thus assume that output buffer 62 is selected. Then, at step 248, a logic 0 is loaded into output BS cells 16, 34, and 60 and output enabling values are loaded into output enable BS cells 22 and 56. Then, at step 250, a logic 0 is driven into output buffers 18, 36, and 62 and a logic 1 is driven into output buffer 44. Then, at step 252, a determination is made that output buffers 18, 36, and 62 have been selected and that output buffer 44 has not been selected so the test returns to step 246. Then, at step 246, the only remaining output buffer 44 is selected. Then, at step 248, a logic 0 is loaded into output BS cells 16, 34, 42, and 60 and output enabling values are loaded into output enable BS cells 22 and 56. Then, at step 250, a logic 0 is driven into output buffers 18, 36, 44, and 62. Then, at step 252, a determination is made that all of the output buffers have been selected so the test advances to step 254 of FIG. 11. Then, at step 254, the output pins 24, 38, 46, and 64 are strobed for the expected values. The enhanced VOL test ends at step 256 of FIG. 11.

Third, assume for purposes of a C3 example that BS cell 16 is a bidirectional output BS cell, that BS cell 22 is a bidirectional output enable, that BS cell 28 is a bidirectional input, that BS cell 42 is a 2-state output, and that BS cell 50 is an input. BS enable cell 56 is for 3-state output BS cells 34 and 60 as shown. From this, it is assumed that these BS cells are connected to pins 20, 26, 38, 46, 54, and 64 as shown. Given this assumed pin layout, the enhanced VOL test for C3 starts at step 240 of FIG. 11. Then, at step 242 of FIG. 11, the bidirectional pin 24 is floated externally.

Then, at step 244 of FIG. 11, pins 24, 38, 46, and 64 are partitioned into subsets. In this C3 example, the location of the ground pins is unknown and is assumed in one of two ways. In either way, pin 14 is assumed to be a ground pin. In the first way, if the average number of output pins between consecutive ground pins is known to be 2, one counts down 2 and the first pin after that that is neither an input nor an output is also assumed to be a ground pin. The rest of the ground pins are determined by repeating this count until the end is reached. In the second way, if the maximum number of pins that can be switched is known to be 2, one takes the total number of output pins 4 and divides that by 2 and counts down 2 and the first pin after that that is neither an input nor an output is also assumed to be a ground pin. The rest of the ground pins are determined by repeating this count until the end is reached. In either way, it turns out here that pins 40 and 66 are also assumed to be ground pins. In this C3 example, there are only two subsets. S1 is between consecutive ground pins 14 and 40 and contains pins 24 and 38. S2 is between ground pins 40 and 66 and contains pins 46 and 64.

Then, at step 246 of FIG. 11, at least one pin is selected from each and every subset. In this C3 example, the ground bounce values are unknown so only one pin from each subset is selected whenever possible. Looking first to S1, it is not necessary to select both pins 24 and 38 so either could be selected and thus assume that pin 24 is selected. Looking now to S2, it is not necessary to select both pins 46 and 64 so either could be selected and thus assume that pin 64 is selected.

Then, at step 248 of FIG. 11, a logic 0 is loaded into output BS cells 16 and 60 and output enabling values are loaded into output enable BS cells 22 and 56. Then, at step 250 of FIG. 11, a logic 0 is driven into pins 24 and 64 and a logic 1 is driven into pins 38 and 46. Then, at step 252, a determination is made that pins 24 and 64 have been selected and that pins 38 and 46 have not been selected and the test returns to step 246 of FIG. 11. Then, at step 246, pins 38 and 46 are selected. Then, at step 248, a logic 0 is loaded into output BS cells 16, 34, 42 and 60 and output enabling values are loaded into output enable BS cells 22 and 56. Then, at step 250, a logic 0 is driven into pins 24, 38, 46, and 64. Then, at step 252, a determination is made that all of the pins have been selected so the test advances to step 254 of FIG. Then, at step 254, pins 24, 38, 46, and 64 are strobed for the expected values. The enhanced VOL test ends at step 256 of FIG. 11.

Figure 12:
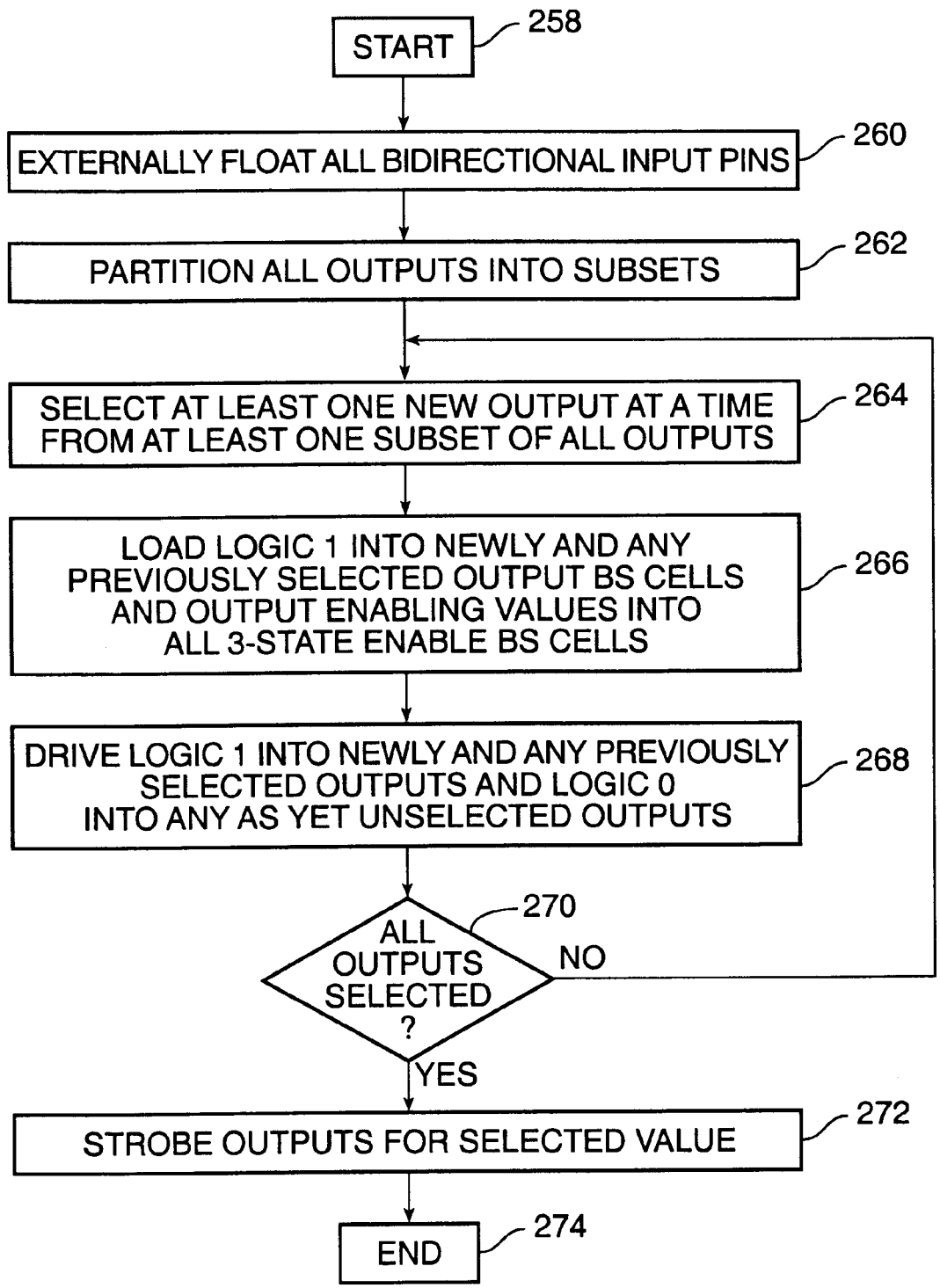
FIG. 12 is a flow diagram of the steps of an enhanced VOH test beginning with all of the outputs in a state other than the Z state.

Turning now to FIG. 12, a flow diagram of the steps of an enhanced VOH test beginning with all of the outputs in a state other than the Z state is shown. Those of ordinary skill in the art will realize that this implies that 3-state enabling values were loaded into all 3-state output enable BS cells. The enhanced VOL test begins at step 258. Next, at step 260, all bidirectional input pins are floated externally.

Next, at step 262, all outputs are partitioned into subsets. How the outputs are partitioned at step 262 will depend on which case one is working under. For the VOH test, the locations of the DC voltage power pins are used in partitioning the outputs into subsets. The partitioning process is similar to that outlined for step 220 of FIG. 10 above except that all outputs and not just 3-state outputs are partitioned.

Next, at step 264, at least one new output at a time from at least one subset of all outputs is selected. Preferably, one and only one output at a time is selected from each and every subset, but more than one could also be selected. However, the more outputs that are selected simultaneously, the less the second goal above may be realized. How the outputs are selected at step 264 will depend on which case one is working under. The selection process is similar to that outlined for step 222 of FIG. 10 above except that all outputs and not just 3-state outputs are selected.

Next, at step 266, a logic 1 is loaded into all newly and any previously selected output BS cells and output enabling values are loaded into all output enable BS cells. Next, at step 268, a logic 1 is driven into all newly and any previously selected outputs and a logic 0 is driven into any as yet unselected outputs. Next, at step 270, a determination is made as to whether all of the outputs have been selected. If not, the test returns to step 264. The result is that outputs that have been selected stay selected and that additional outputs are selected through the repetition of steps 264, 266, and 268 until all of the outputs have been selected. Eventually, at step 270, a determination is made that all of the outputs have been selected and the test advances to step 272. Next, at step 272, the outputs are strobed for the expected values. The enhanced VOH test ends at step 274.

Examples of the enhanced VOH test shown in FIG. 12 would be similar to the examples illustrated for FIG. 11 above except that power pins and not ground pins are used to define the subsets, that a logic 1 rather than a logic 0 is loaded in step 266, and that a logic 1 rather than a logic 0 is driven into all newly and any previously selected outputs and a logic 0 rather than a logic 1 is driven into any as yet unselected outputs in step 268 of FIG. 12.

Those of ordinary skill in the art will realize that several variations and combinations of the DC parametric tests outlined above are possible without departing from the invention disclosed within. For example, for an IC that has multiple positive DC power voltage values, it may be desirable to run the VOH tests for each of these positive DC voltage values. Further, it is possible to integrate the VOL and VOH tests together so that they are not each a separate test. This combined test may either be run all the way through or may be run to a mid point where the steps are simply reversed resulting in a complete test. Further still, for the VOL and VOH tests, it is possible to strobe the outputs for their expected values after every drive step rather than just at the end of the selection process.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A method for voltage output low testing of an integrated circuit having a plurality of inputs, a plurality of outputs including both 3-state outputs and 2-state outputs, a plurality of bidirectional input/outputs, a plurality of power pins, a plurality of ground pins, and a boundary scan register having a plurality of boundary scan cells including output boundary scan cells and output enable boundary scan cells, wherein the plurality of 3-state outputs and the plurality of bidirectional outputs are in a Z state, the method comprising the steps of:

floating all bidirectional input pins externally;

loading a logic 0 into all output boundary scan cells and a disable value into all 3-state output enable boundary scan cells;

driving a logic 0 into all 2-state outputs and floating all 3-state outputs;

partitioning all 3-state outputs into subsets;

repetitively selecting at least one new 3-state output at a time from at least one subset;

loading a logic 0 into all output boundary scan cells, an output enabling value into any and all output enable boundary scan cells for newly and any previously selected 3-state outputs, and an output disabling value into any and all output enable boundary scan cells for any as yet unselected 3-state outputs; and driving a logic 0 into all 2-state outputs and newly and any previously selected 3-state outputs and floating any as yet unselected 3-state outputs;

until all 3-state outputs have been selected; and strobing all outputs for expected values.

2. The method of claim 1 wherein the amount of current sourced or sunk by, the location of, and the type of the output, power, and ground pins is known for the integrated circuit and the step of partitioning comprises classifying a subset as those 3-state outputs which are between consecutive ground pins.

3. The method of claim 2 wherein the step of selecting comprises determining which 3-state outputs when taken together exhibit a total ground bounce less then a maximum allowable ground bounce.

4. The method of claim 1 wherein the location of and the type of the output, power, and ground pins is known for the integrated circuit and the step of partitioning comprises classifying a subset as those 3-state outputs which are between consecutive ground pins.

5. The method of claim 4 wherein the step of selecting comprises determining one 3-state output at a time to be designated from each and every subset.

6. The method of claim 1 wherein the order of the boundary scan cells and the average number of output pins between consecutive ground pins is known for the integrated circuit and the step of partitioning comprises:

designating the first pin as a ground pin;

repetitively counting down from the first pin the average number of output pins and designating a resulting pin as a ground pin until the last pin has been reached; and classifying a subset as those 3-state outputs which are between consecutive ground pins.

7. The method of claim 6 wherein the step of selecting comprises determining one 3-state output at a time to be designated from each and every subset.

8. The method of claim 1 wherein the order of the boundary scan cells and the maximum number of output pins that can be switched is known for the integrated circuit and the step of partitioning comprises:

designating the first pin as a ground pin;

repetitively counting down from the first pin the product of the division of the total number of pins by the maximum number of output pins that can be switched and designating a resulting pin as a ground pin until the last pin has been reached; and classifying a subset as those 3-state outputs which are between consecutive ground pins.

9. The method of claim 8 wherein the step of selecting comprises determining one 3-state output at a time to be designated from each and every subset.

10. A method for voltage output high testing of an integrated circuit having a plurality of inputs, a plurality of outputs including both 3-state outputs and 2-state outputs, a plurality of bidirectional input/outputs, a plurality of power pins, a plurality of ground pins, and a boundary scan register having a plurality of boundary scan cells including output boundary scan cells and output enable boundary scan cells, wherein the plurality of 3-state outputs and the plurality of bidirectional outputs are in a Z state, the method comprising the steps of:

floating all bidirectional input pins externally;

loading a logic 1 into all output boundary scan cells and a disable value into all 3-state output enable boundary scan cells;

driving a logic 1 into all 2-state outputs and floating all 3-state outputs;

partitioning all 3-state outputs into subsets;

repetitively selecting at least one new 3-state output at a time from at least one subset;

loading a logic 1 into all output boundary scan cells, an output enabling value into any and all output enable boundary scan cells for newly and any previously selected 3-state outputs, and an output disabling value into any and all output enable boundary scan cells for any as yet unselected 3-state outputs; and driving a logic 1 into all 2-state outputs and newly and any previously selected 3-state outputs and floating any as yet unselected 3-state outputs; until all 3-state outputs have been selected; and strobing all outputs for expected values.

11. The method of claim 10 wherein the amount of current sourced or sunk by, the location of, and the type of the output, power, and ground pins is known for the integrated circuit and the step of partitioning comprises classifying a subset as those 3-state outputs which are between consecutive power pins.

12. The method of claim 11 wherein the step of selecting comprises determining which 3-state outputs when taken together exhibit a total ground bounce less then a maximum allowable ground bounce.

13. The method of claim 10 wherein the location of and the type of the output, power, and ground pins is known for the integrated circuit and the step of partitioning comprises classifying a subset as those 3-state outputs which are between consecutive power pins.

14. The method of claim 13 wherein the step of selecting comprises determining one 3-state output at a time to be designated from each and every subset.

15. The method of claim 10 wherein the order of the boundary scan cells and the average number of output pins between consecutive power pins is known for the integrated circuit and the step of partitioning comprises:

designating the first pin as a power pin;

repetitively counting down from the first pin the average number of output pins and designating a resulting pin as a power pin until the last pin has been reached; and classifying a subset as those 3-state outputs which are between consecutive power pins.

16. The method of claim 15 wherein the step of selecting comprises determining one 3-state output at a time to be designated from each and every subset.

17. The method of claim 10 wherein the order of the boundary scan cells and the maximum number of output pins that can be switched is known for the integrated circuit and the step of partitioning comprises:

designating the first pin as a power pin;

repetitively counting down from the first pin the product of the division of the total number of pins by the maximum number of output pins that can be switched and designating a resulting pin as a power pin until the last pin has been reached; and classifying a subset as those 3-state outputs which are between consecutive power pins.

18. The method of claim 17 wherein the step of selecting comprises determining one 3-state output at a time to be designated from each and every subset.

19. A method for voltage output low testing of an integrated circuit having a plurality of inputs, a plurality of outputs including both 3-state outputs and 2-state outputs, a plurality of bidirectional input/outputs, a plurality of power pins, a plurality of ground pins, and a boundary scan register having a plurality of boundary scan cells including output boundary scan cells and output enable boundary scan cells, wherein the plurality of outputs and the plurality of bidirectional outputs are in a state other than a Z state, the method comprising the steps of:

floating all bidirectional input pins externally;

partitioning all outputs into subsets;

repetitively selecting at least one new output at a time from at least one subset;

loading a logic 0 into newly and any previously selected output boundary scan cells and an output enabling value into all output enable boundary scan cells;

driving a logic 0 into newly and any previously selected outputs and a logic 1 into any as yet unselected outputs;

until all outputs have been selected; and strobing all outputs for expected values.

20. The method of claim 19 wherein the amount of current sourced or sunk by, the location of, and the type of the output, power, and ground pins is known for the integrated circuit and the step of partitioning comprises classifying a subset as those outputs which are between consecutive ground pins.

21. The method of claim 20 wherein the step of selecting comprises determining which outputs when taken together exhibit a total ground bounce less then a maximum allowable ground bounce.

22. The method of claim 19 wherein the location of and the type of the output, power, and ground pins is known for the integrated circuit and the step of partitioning comprises classifying a subset as those outputs which are between consecutive ground pins.

23. The method of claim 22 wherein the step of selecting comprises determining one output at a time to be designated from each and every subset.

24. The method of claim 19 wherein the order of the boundary scan cells and the average number of output pins between consecutive ground pins is known for the integrated circuit and the step of partitioning comprises:

designating the first pin as a ground pin;

repetitively counting down from the first pin the average number of output pins and designating a resulting pin as a ground pin until the last pin has been reached; and classifying a subset as those outputs which are between consecutive ground pins.

25. The method of claim 24 wherein the step of selecting comprises determining one output at a time to be designated from each and every subset.

26. The method of claim 19 wherein the order of the boundary scan cells and the maximum number of output pins that can be switched is known for the integrated circuit and the step of partitioning comprises:

designating the first pin as a ground pin;

repetitively counting down from the first pin the product of the division of the total number of pins by the maximum number of output pins that can be switched and designating a resulting pin as a ground pin until the last pin has been reached; and classifying a subset as those outputs which are between consecutive ground pins.

27. The method of claim 26 wherein the step of selecting comprises determining one output at a time to be designated from each and every subset.

28. A method for voltage output high testing of an integrated circuit having a plurality of inputs, a plurality of outputs including both 3-state outputs and 2-state outputs, a plurality of bidirectional input/outputs, a plurality of power pins, a plurality of ground pins, and a boundary scan register having a plurality of boundary scan cells including output boundary scan cells and output enable boundary scan cells, wherein the plurality of outputs and the plurality of bidirectional outputs are in a state other than a Z state, the method comprising the steps of:

floating all bidirectional input pins externally;

partitioning all outputs into subsets;

repetitively selecting at least one new output at a time from at least one subset;

loading a logic 1 into newly and any previously selected output boundary scan cells and an output enabling value into all 3-state output enable boundary scan cells;

driving a logic 1 into newly and any previously selected outputs and a logic 0 into any as yet unselected outputs;

until all outputs have been selected; and strobing all outputs for expected values.

29. The method of claim 28 wherein the amount of current sourced or sunk by, the location of, and the type of the output, power, and ground pins is known for the integrated circuit and the step of partitioning comprises classifying a subset as those outputs which are between consecutive power pins.

30. The method of claim 29 wherein the step of selecting comprises determining which outputs when taken together exhibit a total ground bounce less then a maximum allowable ground bounce.

31. The method of claim 28 wherein the location of and the type of the output, power, and ground pins is known for the integrated circuit and the step of partitioning comprises classifying a subset as those outputs which are between consecutive power pins.

32. The method of claim 31 wherein the step of selecting comprises determining one output at a time to be designated from each and every subset.

33. The method of claim 28 wherein the order of the boundary scan cells and the average number of output pins between consecutive power pins is known for the integrated circuit and the step of partitioning comprises:

designating the first pin as a power pin;

repetitively counting down from the first pin the average number of output pins and designating a resulting pin as a power pin until the last pin has been reached; and classifying a subset as those outputs which are between consecutive power pins.

34. The method of claim 33 wherein the step of selecting comprises determining one output at a time to be designated from each and every subset.

35. The method of claim 28 wherein the order of the boundary scan cells and the maximum number of output pins that can be switched is known for the integrated circuit and the step of partitioning comprises:

designating the first pin as a power pin;

repetitively counting down from the first pin the product of the division of the total number of pins by the maximum number of output pins that can be switched and designating a resulting pin as a power pin until the last pin has been reached; and classifying a subset as those outputs which are between consecutive power pins.

36. The method of claim 35 wherein the step of selecting comprises determining one output at a time to be designated from each and every subset.

* * * * *